United States Patent [19]

Bril

[11] Patent Number: 4,708,767
[45] Date of Patent: Nov. 24, 1987

[54] METHOD FOR PROVIDING A SEMICONDUCTOR DEVICE WITH PLANARIZED CONTACTS

[75] Inventor: Thijs W. Bril, Sunnyvale, Calif.

[73] Assignee: Signetics Corporation, Sunnyvale, Calif.

[21] Appl. No.: 658,323

[22] Filed: Oct. 5, 1984

[51] Int. Cl.[4] .................. B44C 1/22; H01L 21/302; H01L 21/31
[52] U.S. Cl. .................................. 437/18; 156/644; 156/653; 156/656; 156/657; 156/659.1; 156/643; 204/192.3; 204/192.32; 437/192
[58] Field of Search ............... 156/643, 653, 656, 657, 156/644, 659.1, 668, 661.1, 663; 204/192.3, 192.32; 29/578, 580, 571; 148/DIG. 20, DIG. 19, DIG. 131, 187; 427/89, 93

[56] References Cited

U.S. PATENT DOCUMENTS

| | | | |
|---|---|---|---|
| 4,025,411 | 5/1977 | Hom-Ma et al. | 156/643 X |
| 4,073,054 | 2/1978 | Kaji et al. | 204/192 E X |
| 4,180,432 | 12/1979 | Clark | 156/657 X |
| 4,451,326 | 5/1984 | Gwozdz | 156/657 X |
| 4,466,177 | 8/1984 | Chao | 29/571 |
| 4,470,874 | 9/1984 | Bartush et al. | 156/643 |
| 4,481,070 | 11/1984 | Thomas et al. | 156/643 X |
| 4,515,652 | 5/1985 | Gimpelson et al. | 156/668 X |
| 4,539,744 | 9/1985 | Burton | 29/580 |
| 4,543,597 | 9/1985 | Shibata | 357/23.6 |
| 4,545,852 | 10/1985 | Barton | 156/643 |
| 4,594,769 | 6/1986 | Ellwanger | 29/580 X |

OTHER PUBLICATIONS

Vossen et al., *Thin Film Processes*, Academic Press, New York, New York, 1978, pp. 309, 310, 316, 317.
Mucha, J. A., "The Gases of Plasma Etching: Silicon-Based Technology", Solid State Technology, Mar. 1985, pp. 123-127.
Kircher et al., "Interconnection Method for Integrated Circuits", IBM Tech. Discl. Bulletin, vol. 13, No. 2, Jul. 1970, p. 436.
Hom-Ma et al., "LSI Surface Leveling by RF Sputter Etching", J. Electrochem. Soc., vol. 126, No. 9, Sep. 1979, pp. 1531-1533.
Adams et al, "Planarization of Phosphorus-Doped Silicon Dioxide", J. Electrochem. Soc., vol. 128, No. 2, Feb. 1981, pp. 423-429.
Gimpelson et al., "Plasma Planarization with a Non-Planar Sacrifical Layer", V-Mic Conference, Jun. 21-22, 1984, pp. 37-44.

Primary Examiner—Donald E. Czaja
Assistant Examiner—Ramon R. Hoch
Attorney, Agent, or Firm—Norman N. Spain

[57] ABSTRACT

Planarized insulating layers provided with planarized contacts are formed on semiconductor devices by forming vias through an insulating layer having a generally planar exposed surface, depositing a layer of a conductive layer on this upper surface of the insulating layer in an amount at least sufficient to at least partially fill all of the vias, depositing a planarized layer on the exposed surface of the conductive layer and then etching away the planarized layer and the conductive layer by use of an etchant that removes the planarized layer and the conductive layer at substantially the same rate, until the generally planar upper surface of the insulating layer is exposed.

28 Claims, 11 Drawing Figures

METHOD FOR PROVIDING A SEMICONDUCTOR DEVICE WITH PLANARIZED CONTACTS

BACKGROUND OF THE INVENTION

This invention relates to methods particularly adapted for manufacturing semiconductor devices and for the formation of an insulating layer having a planar surface and supplied with planar contacts in semiconductor devices.

In both bipolar and MOS semiconductor devices in order to provide an electrically conductive path to selected active regions, a patterned conductive layer overlying silicon dioxide insulating regions and silicon active regions formed in a silicon wafer, is provided. Such a patterned conductive layer is generally created by depositing a metal layer or a layer formed of another conductive material on the upper surface of the silicon wafer and removing undesired parts of the conductive layer.

Frequently, it is necessary to deposit additional conductive layers overlying this conductive layer in order to provide the required contacts. In order to do this it is necessary to first deposit an insulating layer on the upper surface of the patterned conductive layer.

Generally the profile of the top of this insulating layer reflects the profile of the patterned conductive layer. Since the surface of this insulating layer is therefore necessarily uneven it has generally been found difficult to provide a second conductive layer with a profile sufficiently planar to allow good continuous coverage by succeeding layers.

Additionally, in some devices active semiconductor regions along the upper surface of the silicon wafer are separated by thickened insulating field-oxide regions of silicon dioxide that are grown laterally around the silicon active regions. In many of these devices the profile of these field-oxide regions along the edges of the active regions are in the shape of a bird's head with the bird's head protruding upward along adjacent parts of the field-oxide regions and the silicon active regions.

The presence of this upwardly protruding bird's head in the underlying structure adds to the difficulty presented by the patterned conductive layer in the formation of succeeding layers.

Several methods have been disclosed for reducing the unevenness present in the upper surface of the underlying semiconductor by removing at least part of the bird's head.

One method of accomplishing this result is disclosed in Y. Hom-Ma et al, U.S. Pat. No. 4,025,411. In this method a photoresist layer, the upper surface of which is essentially planar, is formed on the bird's head and on the adjacent parts of the semiconductor structure. This structure is then subjected to a sputter etching process in which the photoresist and the silicon oxide are etched at about the same rate. As a result, the bird's head is removed without removing adjacent parts of the field-oxide isolation region.

The Hom-Ma et al patent also employs an ion milling technique to planarize an insulating layer formed on a patterned metal layer deposited on a flat surface. In this method a polymeric layer having an essentially planar upper surface is formed on the upper surface of the insulating layer. The polymeric layer is then ion milled to bring the planar surface downward until the metal is exposed. This technique however is not useful when the first metal layer overlies a bird's head and must be electrically separated from an overlying second metal layer.

Further this ion milling technique of the Hom-Ma et al patent is also not useful when it is desired to provide a semiconductor device with a generally planar insulating layer and to provide such a layer with generally planar contacts.

SUMMARY OF THE INVENTION

A principal object of this invention is to provide an improved method for the manufacture of a semiconductor device having a generally planar insulating layer provided with generally planar contacts.

This and other objects of the invention will be apparent from the description that follows.

One aspect of the invention involves a novel method for providing a semiconductor device comprising a semiconductor body having laterally electrically insulated active areas with an overlying insulating layer having a generally planar surface and planar contacts.

According to this aspect of the invention a first insulating layer having a generally planar outer surface is formed on the upper surface of a patterned conductive layer situated on a semiconductor body having laterally electrically isolated active areas. At least one via is formed through the insulating layer to an active area of the semiconductor body or to the patterned conductive layer by plasma etching with an anisotropic etch process, the etching rate of which is significantly greater for the material of the insulating layer than for the material of the conductive layer and of the semiconductor body.

A second conductive layer is then deposited on the upper surface of the insulating layer, the thickness of this second conductive layer being sufficient to at least partially fill each via. A next planarized layer having a generally planar upper surface is now formed on the upper surface of the second conductive layer. This next planarized layer and the second conductive layer are then etched with etchant that attacks the second conductive layer and the planarized layer at substantially equal rates. This etching is continued until the planar upper surface of the first insulating layer is exposed.

As a result of this novel combination of steps, the semiconductor device now is furnished with an insulating layer having a generally planar upper surface supplied with contacts all of which contacts, regardless of the via depth, are essentially planar.

Another aspect of the invention involves a method for providing a semiconductor device comprising a semiconductor body, the upper surface of which has a significant surface irregularity such as an upwardly protruding region, with an insulating layer having a generally planar outer surface and planar contacts. This novel method is of particular use in the case where the semiconductor body is a silicon wafer supplied with active regions laterally separated by thick insulating field regions of silicon dioxide grown laterally around the active regions. In many devices these insulating field regions develop in the shape of a bird's head along the edge of each active region protruding upwardly along adjacent parts of the insulating and active regions. A patterned conductive layer lies over the body, including over the protrusions.

The upper surface of the patterned conductive layer serving to provide electrical contact to selected active regions has at least one difference in height in addition to that resulting from its pattern. Each of these additional differences in height results extends from the top of the portion of the conductive layer above each bird's head to the top of the conductive portions adjacent to the bird's head.

According to this aspect of the invention, an insulating layer having a generally planar surface and planar contacts is provided on such a semiconductor body in which the patterned conductive layer has at least one portion protruding upwardly beyond adjacent parts of the conductive layer. This feature of the invention involves a novel manufacturing method in which the following combination of steps are employed.

In accordance with the method as described in the commonly assigned U.S. Pat. No. 4,594,769 filed June 15, 1984 by Ellwanger, the following steps are first carried out:

An insulating layer is formed on the patterned conductive layer and on adjacent exposed parts of the semiconductor body, the upper surface of this insulating layer protruding upwardly with corresponding upwardly protruding portions of the underlying conductive layer. An additional layer having a generally planar outer surface is formed on this insulating layer.

At least part of the protruding portion of the insulating layer is now exposed by etching the additional layer with etchant that attacks the material of the additional layer at a significantly higher rate than the material of the insulating layer.

The remainder of the additional layer and the insulating layer, as it becomes exposed, is now etched with etchant that etches the materials of the insulating layer and the additional layer at substantially equal rates. As a result, the insulating layer is provided with a generally planar upper surface.

Following the procedure of Ellwanger, at least one via leading through the insulating layer to the conductive layer, or to an active area of the semiconductor body, is now plasma etched with an anisotropic etch process, the etching rate of which is significantly higher for the material of the insulating layer than for the material of the conductive layer and the material of the semiconductor body.

After via formation, a second conductive layer of a thickness sufficient to at least partially fill each via is formed on the planar upper surface of the first insulating layer.

A planarizing layer having a generally planar upper surface is then formed on the upper surface of the second conductive layer. This planarizing layer and the second conductive layer are etched in a two-step process similar to that described above. Etchant that attacks the material of the planarizing layer much more than that of the second conductive layer is first used, followed by etchant that attacks both of these layers at substantially equal rates until the upper surface of the first insulating layer is exposed.

As a result not only is the upper surface of the insulating layer generally planar but all contacts made through vias extending through this layer are essentially planar with the outer surface of this layer. Consequently, the problem of discontinuities or other irregularities appearing in overlying layers is greatly reduced.

DESCRIPTION OF THE PREFERRED EMBODIMENT

Referring to FIGS. 1a–1f of the drawings, the following manufacturing procedure is carried out according to the method described in page 5, line 15–page 8, line 30 of the Ellwanger patent application.

Figure 1A:
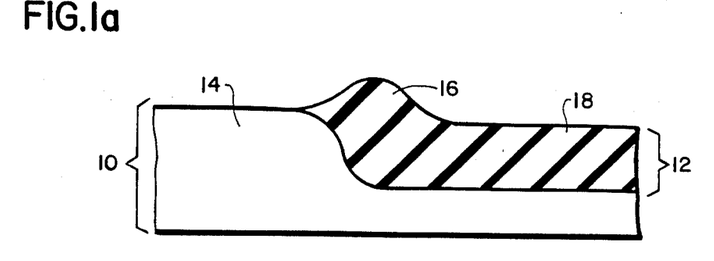
FIGS. 1a, 1b, 1c, 1d, 1e and 1f are cross-sectional front views of a semiconductor structure representing stages in its manufacture according to the method described in the copending Ellwanger U.S. patent application Ser. No. 621,001.

The starting material is a semiconductor body 10 having a monocrystalline silicon substrate doped with suitable P-type and/or N-type semiconductor impurities. Body 10 may have an epitaxial layer (not explicitly shown in the drawings) along the top of the substrate.

A thick electrically insulating region 12 of silicon dioxide having a thickness of about 1.4 microns is grown along the upper surface of body 10 according to conventional techniques so as to laterally surround an active semiconductor region 14 and thereby isolate it from other such active semiconductor regions. This is typically done by forming a silicon oxynitride layer along the upper surface of body 10, forming grooves through the oxynitride layer and into the underlying silicon at the intended location for oxide-isolation region 12, and then heating the structure to grow region 12. In subsequent steps, the oxynitride layer is removed and various N-type and/or P-type regions (not shown) are formed in region 14. Any material that is not monocrystalline silicon is removed from the top of region 14. This leads to the structure depicted in FIG. 1a.

As a result of the oxide-isolation process, field-oxide region 12 has an upward-protruding portion 16 in the shape of a bird's head along the edge of region 14. Bird's head 16 protrudes about 0.4 micron above the adjacent main part 18 of insulator 12 and several hundred angstroms less than this above active region 14.

Figure 1B:
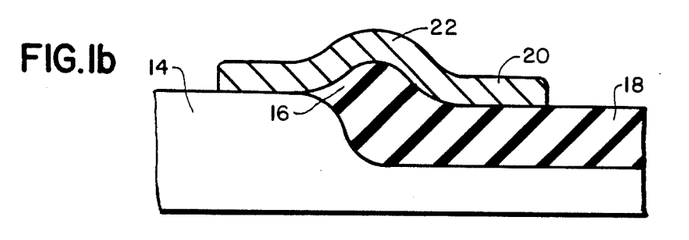

A patterned electrically conductive layer 20 having a thickness of about 0.5 micron is formed over bird's head 16 and the adjacent parts of regions 14 and 18 as shown in FIG. 1b. Conductive layer 20 is created by depositing a metal layer such as an alloy of aluminum with 0.5% by weight of copper or a layer of polycrystalline silicon doped with N or P type impurities on the entire upper surface of the structure, forming a photoresist mask over the intended location for layer 20, and removing the undesired parts of the metal layer with an etchant such as a plasma consisting of boron trichloride and chlorine. In FIG. 1b, layer 20 is a conductive line extending parallel to the plane of the figure. Because of the presence of bird's head 16, a portion 22 of layer 20 protrudes upward beyond the adjacent parts of layer 20.

Figure 1C:
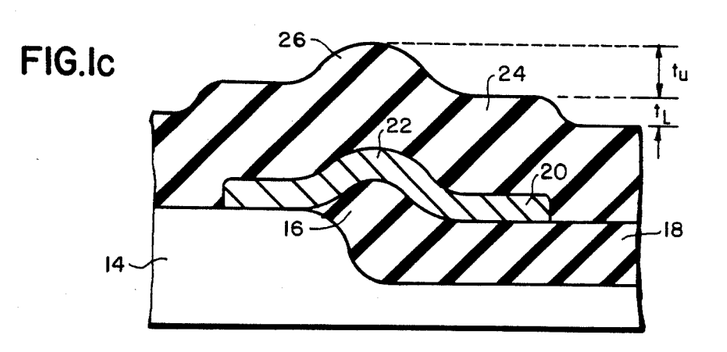

An electrically insulating layer 24 of silicon dioxide with about 12% weight phosphorus pentoxide is chemically vapor deposited on the entire top surface of the structure as shown in FIG. 1c. The resultant phosphosilicate glass (PSG) of insulating layer 24 has an average thickness of 1.4 micron. Because this deposition is done at atmospheric pressure, slightly more PSG accumulates above metal protrusion 22. As a result, insulating layer 24 has an upward protruding part 26 having a thickness of about 1.55 microns above metal protrusion 22. A height difference $t_U$ of about 0.55 micron thereby exists between the top of the insulating oxide protrusion 26 and the top of the adjacent part of insulator 24 overlying conductor 20 above main field-oxide part 18. The steps at the edges of conductor 20 are largely reflected in insulating layer 24. Accordingly, a height difference $t_L$ of about 0.5 micron exists between the top of the part of layer 24 contacting main insulating part 18 and the top of the adjacent part of layer 24 above layer 20.

Figure 1D:
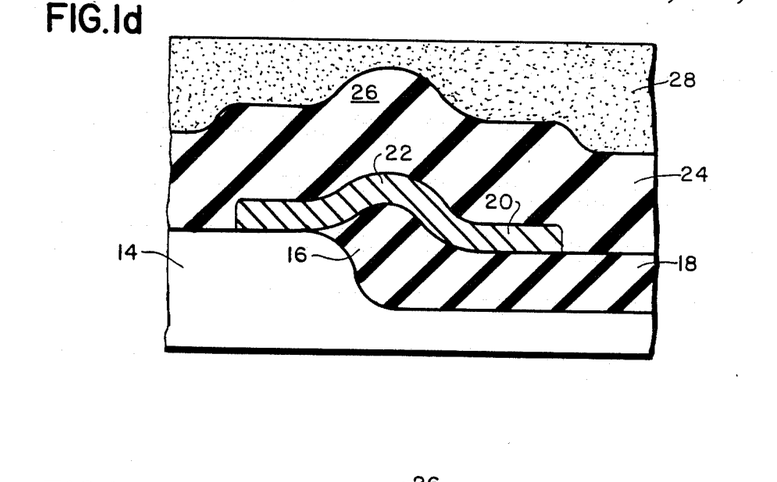

About 1.2 microns of Hunt's Positive Photoresist 204 is deposited on the entire upper surface of insulator 24. The photoresist is soft baked at 103° C. for 30 minutes and flood exposed. The photoresist is then heated at 200° C. for 30 minutes. This causes the photoresist to flow until it becomes a layer 28 having a generally planar upper surface as indicated in FIG. 1d.

Figure 1E:
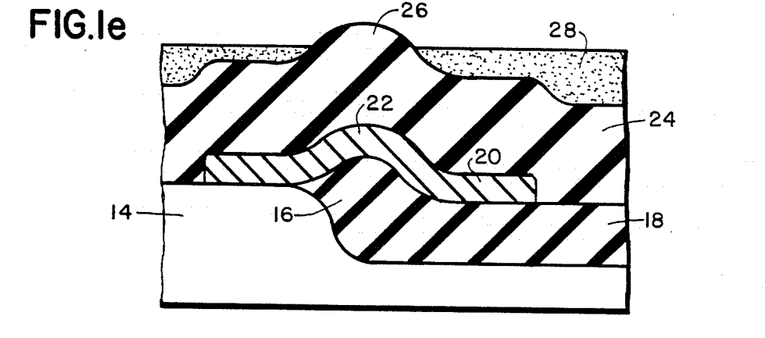

This structure now is placed in an AME 8110 hexoidal plasma reactor made by Applied Materials, Inc. The reactor is evacuated to a pressure of 80 millitorr. The structure is subjected for 5.5 minutes to a plasma consisting of oxygen at a flow rate of 80 standard cm³/min (SCCM). The RF power for the reactor is 1,350 watts. The oxygen plasma attacks the photoresist in layer 28 much more than the PSG in layer 24. As shown in FIG. 1e, a part of protrusion 26 is thereby exposed as photoresist layer 28 is etched downward. The exposed part of protrusion 26 extends about 0.35 micron above the resulting upper surface of the remainder of layer 28.

Figure 1F:
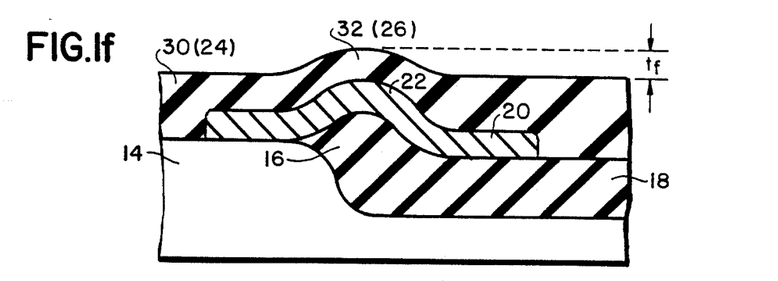

While the structure is still in the plasma reactor, the structure is subjected for 14 minutes to a plasma consisting of oxygen at a flow rate of 33 SCCM and carbon tetrafluoride at 47 SCCM. The RF power remains at 1,350 watts. The oxygen/carbon tetrafluoride plasma attacks the photoresist and PSG at very close to the same rate. The upper surface material of photoresist layer 28 and insulating layer 24 as it becomes exposed is progressively removed. The upper surface moves downward approximately equal amounts at all points until the structure of FIG. 1f is achieved.

The steps at the edge of conductor 20 are now reflected in the remainder 30 of insulator 24. The remaining part 32 of insulating protrusion 26 largely conforms to the upper surface of conductive protrusion 22. The height difference $t_F$ between the lowest and highest parts of the upper insulating surface is now only about 0.35 μm. Insulator 30 thereby has a thickness varying from a minimum of about 0.9 μm at part 32 to a maximum of about 1.4 μm where remainder 30 adjoins main field-oxide part 18. The oxide thickness is also about 1.4 μm where insulator 30 adjoins active region 14.

Figure 2A:
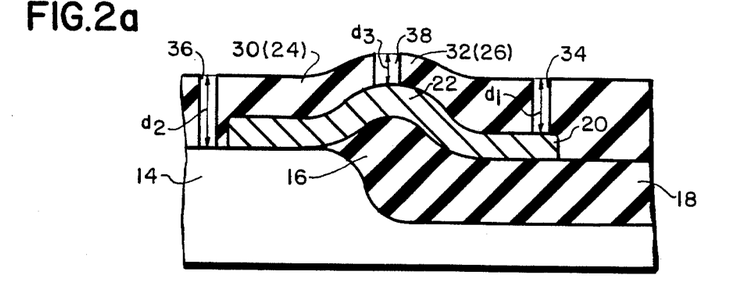
FIGS. 2a, 2b and 2c are cross-sectional front views of a semiconductor structure representing stages in the manufacture thereof according to the instant invention.

Vias represented by vias 34, 36 and 38 are now opened up through insulation layer 24 to a lower portion of conductive layer 20 at a depth $d_1$ of 1.05 μm, to an active area of body 14 at a depth $d_2$ of 1.4 μm, and to protrusion 22 at a depth $d_3$ of 0.9 μm, respectively. As a result, a structure as shown in FIG. 2a is obtained.

These vias are produced by forming a photoresist mask with holes at the locations of vias 34, 36 and 38 on the insulator layer 24, etching through these holes with an anisotropic etchant which has a much higher etch rate for the phospho-silicate glass of insulator layer 24 than for the materials of conductor 20 and semiconductor body 10.

Typically, such an etching process is carried out in an Applied Materials AME-8110 reactive ion etcher employing a mixture of $CHF_3$ and $CO_2$ as the etch gas at 45 SCCM and 5 SCCM, respectively.

Figure 2B:
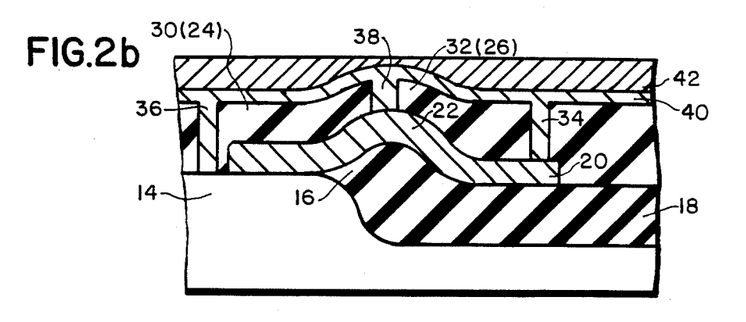

A layer 40 of approximately 1.4 μm of electrically conductive polysilicon is now deposited with LPCVD, the polysilicon being replaceable by W or Al or a metal silicide such as Ti silicide or W silicide or mixtures of W, Al and a metal silicide. With this thickness all the vias are filled. However, if the widths of the vias 34, 36 and 38 are small enough the deposition thickness of the polysilicon layer 40 may be as little as one half the width of the widest via.

A photoresist layer 42 such as HPR 204 is now applied by spinning on at a thickness of 1.2 μm. This resist coating is then planarized by being flood exposed and hard-baked at 200° C. for 30 minutes. A structure as shown in FIG. 2b is thereby produced.

The resist coating is now etched back in an Applied Materials AME-8120 reactive etcher in a two-step process. The etcher is evacuated to a pressure of 80 millitorr. The structure is subjected for 5.5 minutes to an oxygen plasma at 80 SCCM. The RF power is 1,350 watts. The oxygen plasma attacks the photoresist in layer 42 much more than the polysilicon in layer 40. A prt of layer 40 at via 38 is thereby exposed as layer 42 is etched downward. The exposed part of layer 40 extends about 0.35 μm above the resulting upper surface of the remainder of layer 42.

While the structure is still in the etcher, the structure is subjected to a plasma consisting of oxygen at 15 SCCM and $NF_3$ at 65 SCCM. By regulating the gas composition, pressure and power, the etch rates for the resist layer 42 and the polysilicon layer 40 are approximately equal. This etching procedure is continued until the resist layer 42 is removed, the resultant planar upper surface of insulating layer 30 is exposed and the structure of FIG. 2c in which the insulating layer 30 is supplied with generally planarized contacts 44, 46 and 48 is achieved.

Figure 2C:
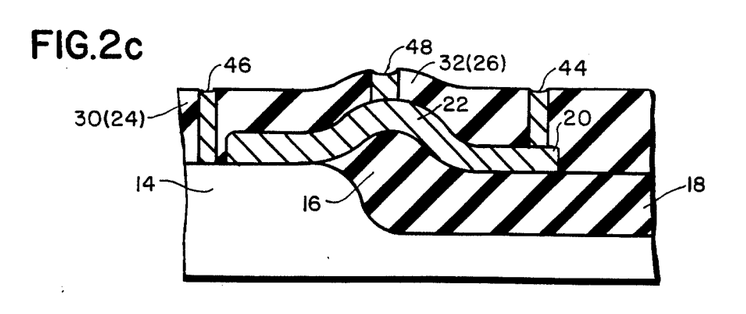

If the widths of the vias are sufficiently small, no photoresist layer is necessary. In this case, only the second etching step described in the previous paragraph is performed.

Figure 3A:
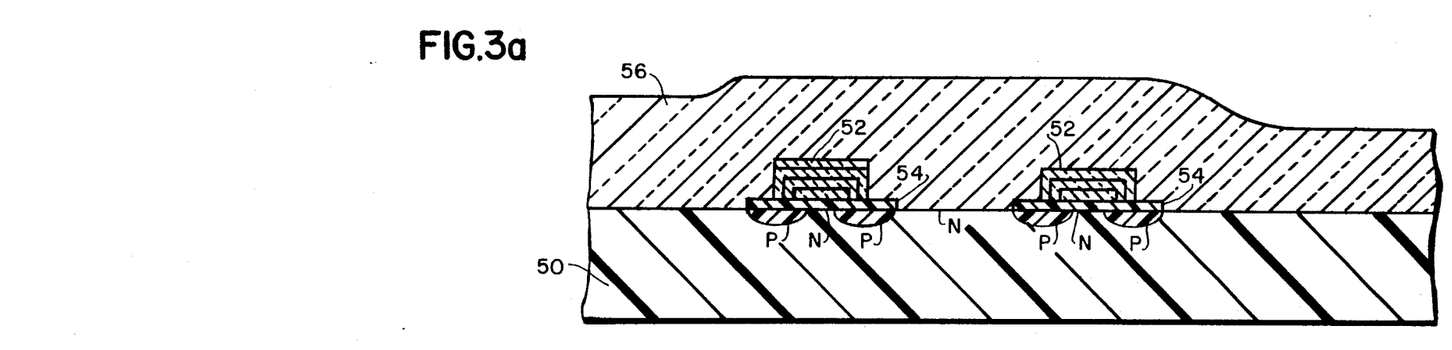
FIGS. 3a and 3b are cross-sectional front views representing stages in the manufacture of an MOS device according to the method of the invention.

By a similar technique an MOS semiconductor device having laterally electrically insulated active areas is produced from a semiconductor structure, a front cross-sectional view of which is shown in FIG. 3a.

As shown, this initial structure includes a silicon substrate 50 doped as indicated, supplied with two electrically insulated polysilicon conductive layers 52 each overlying the silicon substrate 50 and each in turn isolated from the silicon substrate by a silicon dioxide gate layer 54. An insulation layer consisting of phospho-silicate glass is formed on the top surface of this structure. A field-oxide layer 58 is also shown.

Figure 3B:
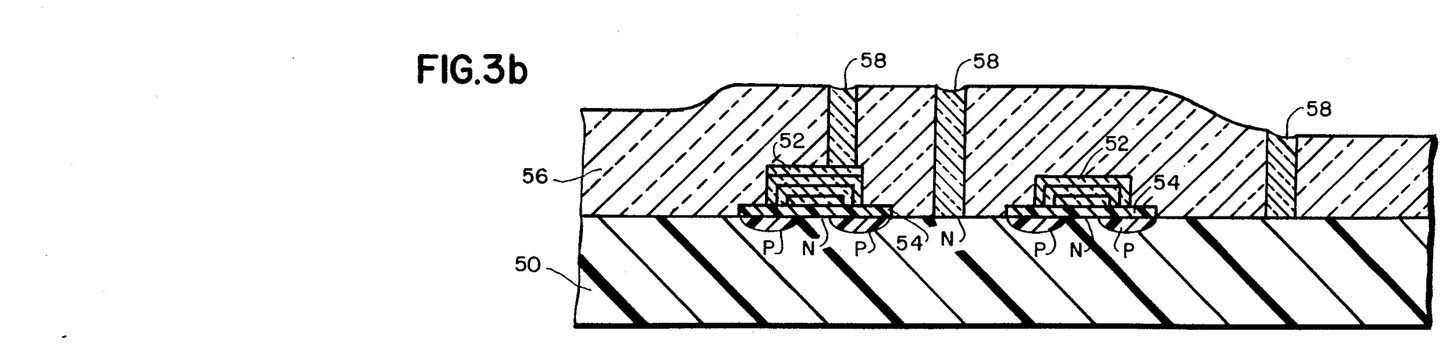

By a technique similar to that previously described, vias are etched through the phospho-silicate glass layer 56, a conductive polysilicon layer sufficient to at least fill the vias is depositd on the surface of PSG layer 56, and a planarized photoresist layer is formed on the top of the structure. The planarizing layer and the polysilicon layer are then etched back leaving exposed the phospho-silicate glass layer 56 supplied with planarized contacts 58, the resultant structure being shown in FIG. 3b. This is done in a one-step process using a plasma etchant that attacks the polysilicon and photoresist at approximately equal rates.

While the present invention has been described with reference to particular embodiments thereof, it will be understood that numerous modifications can be made by those skilled in the art without actually departing from the scope of the invention. For example, ion milling, reactive ion milling, and sputter etching are forms of plasma etching.

What is claimed is:

1. A manufacturing method for providing a semiconductor device with an insulating layer having a generally planar surface and planar contacts according to the steps of:
   providing a semiconductor body having active areas with a patterned first electrically conductive layer having at least a portion protruding upward beyond adjacent parts of said conductive layer;
   forming a first electrically insulating layer on said first electrically conductive layer and on exposed adjacent parts of said semiconductor body in a manner such that a portion of said first insulating layer protrudes upwardly beyond adjacent parts of said first insulating layer generally at the location above the protruding portion of said first conductive layer;
   forming an additional layer having a generally planar upper surface on said first electrically insulating layer;
   exposing at least part of the protruding portion of said first electrically insulating layer by etching said additional layer with etchant that attacks the material of said additional layer at a significantly greater rate than the material of said first electrically insulating layer;
   etching the remainder of said additional layer and said first electrically insulating layer, as it becomes exposed, with etchant that etches the materials of said first electrically insulating layer and said additional layer at substantially equal rates thereby forming a generally planar upper surface on said first electrically insulating layer;
   forming at least one via to said first electrically conductive layer and at least one via to an active area of said semiconductor body by plasma etching through the remainder of said first insulating layer down to said first electrically conductive layer and to active areas of said semiconductor body;
   forming, on the upper surfce of said first insulating layer, a second conductive metal layer of a thickness sufficient to at least partially fill all said vias;
   at least one of said conductive layers being formed by vapor deposition;
   forming on said second conductive layer a planarizing layer having a generally planar upper surface;
   exposing at least part of said second conductive layer by etching said planarizing layer with etchant that attacks material of said planarizing layer at a significantly greater rate then material of said second conductive layer;
   and then etching said planarizing layer and said second conductive layer, as it becomes exposed, with etchant that attacks said second conductive layer and said planarizing layer at substantially equal rates until the upper surface of said first insulating layer is exposed.

2. The method of claim 1 wherein said first insulating layer comprises a silicon-dioxide containing material.

3. The method of claim 2 wherein said planarizing layer is an organic resist layer.

4. The method of claim 1 wherein each of said vias is formed by plasma etching with an anisotropic etch, the etch rate of which is significantly greater for said material of said first insulating layer than for the material of said first conductive layer.

5. The method of claim 2 wherein each of said vias is formed by plasma etching with an anisotropic etch, the etch rate of which is significantly greater for said material of said first insulating layer than for the material of said first conductive layer.

6. The method of claim 4 wherein said first insulating layer is a phospho-silicate glass.

7. The method of claim 1 wherein at least one of the conductive layers is formed by chemical vapor deposition.

8. The method of claim 7 wherein the first insulating layer comprises a semiconductor oxide.

9. The method of claim 7 wherein the second conductive layer is an electrically conducting polysilicon layer.

10. The method of claim 9 wherein the second conductive layer is formed by chemical vapor deposition.

11. The method of claim 7 wherein the second conductive layer is a metal layer.

12. The method of claim 1 wherein the second conductive layer is formed by chemical vapor deposition.

13. The method of claim 1 wherein the first conductive layer is a metal layer.

14. The method of claim 12 wherein the second conductive layer is a layer of a metal or a metal silicide selected from the group consisting of tungsten, aluminum, tungsten silicide, titanium silicide and mixtures thereof.

15. The method of claim 13 wherein the second conductive layer is a layer of a metal or a metal silicide selected from the group consisting of tungsten, aluminum, tungsten silicide, titanium silicide, and mixtures thereof.

16. The method of claim 4 wherein the etch rate of the anisotropic etch forming each of said vias is significantly greater for the material of said first insulating layer than for the material of said semiconductor body.

17. The method of claim 5 wherein the etch rate of the anisotropic etch forming each of said vias is significantly greater for the material of said first insulating layer than for the material of said semiconductor body.

18. A manufacturing method for providing a semiconductor device with an insulating layer having a generally planar surface and planar contacts according to the steps of:
   providing a semiconductor body having active areas with a patterned first electrically conductive layer having at least a portion protruding upward beyond adjacent parts of said conductive layer;
   forming a first electrically insulating layer comprising a semiconductor oxide on said first electrically conductive layer and on exposed adjacent parts of said semiconductor body in a manner such that a portion of said first insulating layer protrudes upwardly beyond adjacent parts of said first insulating layer generally at the location above the protruding portion of said first conductive layer;
   forming an additional layer having a generally planar upper surface on said first electrically insulating layer;
   exposing at least part of the protruding portion of said first electrically insulating layer by etching said additional layer with etchant that attacks the material of said additional layer at a significantly greater rate than the material of said first electrically insulating layer;
   etching the remainder of said additional layer and said first electrically insulating layer, as it becomes exposed, with etchant that etches the materials of said first electrically insulating layer and said additional layer at substantially equal rates thereby forming a generally planar upper surface on said first electrically insulating layer;

forming at least one via to said first electrically conductive layer and at least one via to an active area of said semiconductor body by plasma etching through the remainder of said first insulating layer down to said first electrically conductive layer to active areas of said insulating layer;

forming, on the upper surface of said first insulating layer, a second conductive layer of a thickness sufficient to at least partially fill all said vias;

at least one of said conductive layers being formed by vapor deposition;

forming on said second conductive layer a planarizing layer having a generally planar upper surface;

exposing at least part of said second conductive layer by etching said planarizing layer with etchant that attacks material of said planarizing layer at a significantly greater rate than material of said second conductive layer;

and then etching said planarizing layer and said second conductive layer, as it becomes exposed, with etchant that attacks said second conductive layer and said planarizing layer at substantially equal rates until the upper surface of said first insulating layer is exposed.

19. The method of claim 18 wherein said first insulting layer comprises a silicon-dioxide containing material.

20. The method of claim 19 wherein said planarizing layer is an organic resist layer.

21. The method of claim 18 wherein each of said vias is formed by plasma etching with an anisotropic etch, the etch rate of which is significantly greater for said material of said first insulating layer than for the material of said first conductive layer.

22. The method of claim 19 wherein each of said vias is formed by plasma etching with an anisotropic etch, the etch rate of which is significantly greater for said material of said first insulating layer than for the material of said first conductive layer.

23. The method of claim 21 wherein the first insulating layer is a phospho-silicate glass.

24. The method of claim 18 wherein at least one of the conductive layers is formed by chemical vapor deposition.

25. The method of claim 24 wherein the first insulating layer comprises a semiconductor oxide.

26. The method of claim 18 wherein the first conductive layer is a metal layer, an electrically conductive polysilicon layer or a metal silicide layer.

27. The method of claim 26 wherein the second conductive layer is a layer of a metal selected from the group consisting of tungsten, aluminum, titanium and the metal silicides.

28. The method of claim 22 wherein the etch rate of the anisotropic etch forming each of said vias is significantly greater for the material of said first insulating layer than for the material of said semiconductor body.

* * * * *

UNITED STATES PATENT AND TRADEMARK OFFICE
CERTIFICATE OF CORRECTION

PATENT NO.   : 4,708,767
DATED        : November 24, 1987
INVENTOR(S)  : Thijs W. Bril It is certified that error appears in the above-identified patent and that said Letters Patent is hereby corrected as shown below:

IN THE CLAIMS

Claim 18, Column 9, line 7   after "layer" insert --and-- line 8   change "active areas" to

--an active area--

Signed and Sealed this

Twenty-fourth Day of January, 1989

Attest:

DONALD J. QUIGG

*Attesting Officer*   *Commissioner of Patents and Trademarks*